(12) United States Patent
Ikada

(10) Patent No.: US 6,369,672 B1
(45) Date of Patent: Apr. 9, 2002

(54) SURFACE ACOUSTIC WAVE FILTER AND COMMUNICATIONS APPARATUS USING THE SAME

(75) Inventor: Katsuhiro Ikada, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/512,531

(22) Filed: Feb. 24, 2000

(30) Foreign Application Priority Data

Mar. 10, 1999 (JP) ............................................ 11-063485

(51) Int. Cl.[7] ............................. H03H 9/64; H03H 9/70; H04B 1/17
(52) U.S. Cl. ...................... 333/193; 333/195; 333/133; 455/285; 455/302
(58) Field of Search ................................ 333/193–196, 333/133; 455/285, 302, 307, 317, 323

(56) References Cited

U.S. PATENT DOCUMENTS

| 5,561,406 A | * 10/1996 | Ikata et al. ............. 333/193 X |
| 5,631,612 A | 5/1997 | Satoh et al. ................. 333/193 |
| 5,796,205 A | 8/1998 | Nishihara et al. ........ 310/313 R |
| 5,999,069 A | * 12/1999 | Ushiroku ..................... 333/193 |
| 6,137,380 A | * 10/2000 | Ushiroku et al. ........... 333/193 |
| 6,150,904 A | * 11/2000 | Taniguchi et al. .......... 333/193 |

FOREIGN PATENT DOCUMENTS

| EP | 0 853 381 A | 7/1998 |
| JP | 5-183380 | 7/1993 |
| JP | 9-261002 | 10/1997 |
| JP | 9-321573 | * 12/1997 |
| JP | 11-340779 | * 12/1999 |

OTHER PUBLICATIONS

J. Iseli; "Receiver Design Simplified By Saw Coupled Resonator Filters"; Proceedings of the Ultrasonic Symposium, US, New York, IEEE, vol. 1; Oct. 1988, pp 209–212; column 1–3.

* cited by examiner

Primary Examiner—Benny Lee
Assistant Examiner—Barbara Summons
(74) Attorney, Agent, or Firm—Keating & Bennett, LLP

(57) ABSTRACT

A surface acoustic wave includes a surface acoustic wave element including a piezoelectric substrate having IDTs, input/output terminals, and reference potential terminals provided thereon and a package enclosing the surface acoustic element and having electrode lands and external terminals. The resonance frequency of the resonator defined by inductances generated by the reference potential terminals of the external terminals of the package, is positioned in the vicinity of an image frequency, occurring at a time of performing frequency conversion in a super heterodyne system.

19 Claims, 11 Drawing Sheets

SURFACE ACOUSTIC WAVE FILTER AND COMMUNICATIONS APPARATUS USING THE SAME

BACKGROUND OF THE INVENTION

1. Field of the Invention

The present invention relates to a surface acoustic wave filter for use in superheterodyne system and a communications apparatus including such a filter.

2. Description of the Related Art

In general, with a mobile communications apparatus such as an automobile telephone and a cellular telephone, a superheterodyne system is used to obtain a high sensitivity and a high stability. This system uses a phenomenon in which, as soon as two signal waves $f_1$ and $f_2$ are mixed together so that it is possible to obtain signal waves ($f_1 \pm f_2$) representing a sum and a difference. This system also involves converting a received signal wave into a low frequency signal. A typical communications apparatus using the system is shown in FIG. 16.

As shown in FIG. 16, in the communications apparatus 100, a high frequency module 120 is connected with an antenna 110, and a signal processing circuit 130 is connected at a rear section of the high frequency module 120.

The high frequency module 120 includes band pass filters 121 and 122, two amplifiers 123 and 124, a mixer 125 and a local oscillator 126.

The first band pass filter 121 may be arranged to select a pass band such that the filter will allow the passing of signals received from the antenna 110, but will attenuate other signals not received from the antenna 110.

The amplifier 123 is provided to amplify a received signal which has passed through the first band pass filter 121.

With the local oscillator 126, the frequency of its local oscillating signal is set such that a sum of the local oscillating signal and the received signal or a difference between these two signals will become a desired intermediate frequency signal.

The mixer 125 is used to mix the local oscillating signal fed from the local oscillator 126 with the received signal, so as to convert these signals into intermediate frequency signals.

With the second band pass filter 122, the pass band is selected such that it attenuates image frequency signals other than the desired intermediate frequency signal generated when the local oscillating signal and the received signal are mixed together in the mixer 125, thereby allowing the passing of the desired intermediate frequency signal.

The second amplifier 124 is used to amplify the intermediate frequency signal which has passed through the second band pass filter 122, thereby transmitting the signal to the signal processing circuit 130 connected at the rear section of the high frequency module 120.

The signal processing circuit 130 is used to process the intermediate frequency signal transmitted hereto, so as to convert the signal into, for example, a sound or the like.

In such a communications apparatus 100, the frequency of the image frequency signal (hereinafter, it will be referred to as "the image frequency") will be determined depending upon the frequency of the local oscillating signal of the local oscillator 126 and the center frequency of the second band pass filter 122. However, such an image frequency will usually be generated at a position that is separated by several hundred MHz from the pass band of the second band pass filter 122.

Conventionally, as a second band pass filter 122, as shown in Japanese Unexamined Patent Publication No. 5-183380, there has been mainly used a ladder-type surface acoustic wave filter connected in a ladder configuration with a plurality of surface acoustic wave resonators.

The ladder-type surface acoustic wave filter includes an area having a high attenuating amount, which area is originally located in the vicinity of its pass band. According to the Japanese Unexamined Patent Publication No. 5-183380, if an inductance is added to the resonators arranged in parallel, it is possible to increase the pass band width of the filter, thereby rendering the high attenuating area to shift towards a low frequency band, thus improving the attenuation characteristic of the low frequency band located in the vicinity of the pass band. However, with the method, since the width of the pass band will at the same time be increased, the filter is not suitable for attenuating image frequency signals generated at positions which are separated by several hundred MHz from the pass band of the filter.

Further, as described in Japanese Unexamined Patent Publication No. 9-261002, an inductance component caused by connecting means such as bonding wires and a capacitance component caused by a connecting portion of a bonding pad with respect to a reference potential, may be both interposed and inserted in parallel with each other, so as to provide a high attenuating area at a desired point on a low frequency band side of the pass band, while at the same time continuously preventing an increase of the width of the pass band.

However, with the method of Japanese Unexamined Patent Publication No. 9-261002, although it was possible to attenuate the image frequency occurring on the low frequency band side of the pass band, it was still difficult to attenuate the image frequency occurring on the high frequency band side of the pass band.

Further, in order to obtain the capacitance component, it is necessary to increase the connecting portions of the bonding pad and floating electrodes. For this reason, a surface acoustic wave element must have a large size, hence making it difficult to produce a surface acoustic wave filter which is compact.

Moreover, if it was desired to obtain a sufficient capacitance component and to prevent any increase in the size of the surface acoustic wave element, it would be necessary that the floating electrode and the connecting portions of the bonding pad be disposed without any slots formed therebetween, resulting in a reduced freedom of design and arranging various elements and connections thereof.

SUMMARY OF THE INVENTION

To overcome the problems described, preferred embodiments of the present invention provide a surface acoustic wave filter capable of attenuating an image frequency, regardless of whether it is generated on a high frequency band side or a low frequency band side of a pass band, without having to increase the size of the surface acoustic wave element.

The surface acoustic wave filter according one preferred embodiment of the present invention includes at least one surface acoustic wave element including a piezoelectric substrate, at least one IDT provided on the piezoelectric substrate, input/output terminals provided on the piezoelectric substrate and reference potential terminals provided on the piezoelectric substrate and both of which are connected with the at least one IDT, a package enclosing the surface acoustic wave element, the package including electrode lands respectively connected with the input/output terminals and the reference potential terminals of the surface acoustic wave element, external terminals connecting the electrode lands on the outer circuit thereof; the surface acoustic wave filter being adapted for use in a superheterodyne system, wherein the resonance frequency of the resonator having the capacities of IDTs of the surface acoustic wave element and having inductances from the reference potential terminals of the surface acoustic wave element to the external terminals of the package, is positioned in the vicinity of an image frequency occurring at the time of performing frequency conversion in the superheterodyne system.

According to the described structure of this preferred embodiment, since inductances are added in series with the capacities of the IDTs, it is possible to attenuate a desired image frequency.

Further, the resonance frequency of the trap resonator may be attenuated either on a high frequency band side or a low frequency band side of the pass band by setting the capacities of the IDTs and the values of the inductances in series therewith, thereby making it possible to cope with a high frequency of the intermediate frequency signal.

Moreover, since only the resonance frequency of the trap resonator is changed, it is possible to attenuate the image frequency without affecting an insertion loss in the pass band.

Further, since the capacity bonding wires of the IDTs and the inductance of the package and the like are used to define a trap resonator with the use of the present structures thereof, it is easy to make the entire surface acoustic wave filter compact. Further, the frequency difference fd1 between the center frequency of the at least one of the surface acoustic wave elements and an image frequency occurring at a time of performing frequency conversion in a corresponding superheterodyne system, is made to be approximately equal to the frequency difference fd2 between the center frequency of another of the at least one of the surface acoustic wave elements and the image frequency occurring at a time of performing frequency conversion in a corresponding superheterodyne system. Therefore, it is possible to use common circuits for signal processing from the intermediate frequency signals onward, with respect to a plurality of filters which include a plurality of surface acoustic wave elements. Thus, it is possible to reduce the number of the parts and elements required to construct the device.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
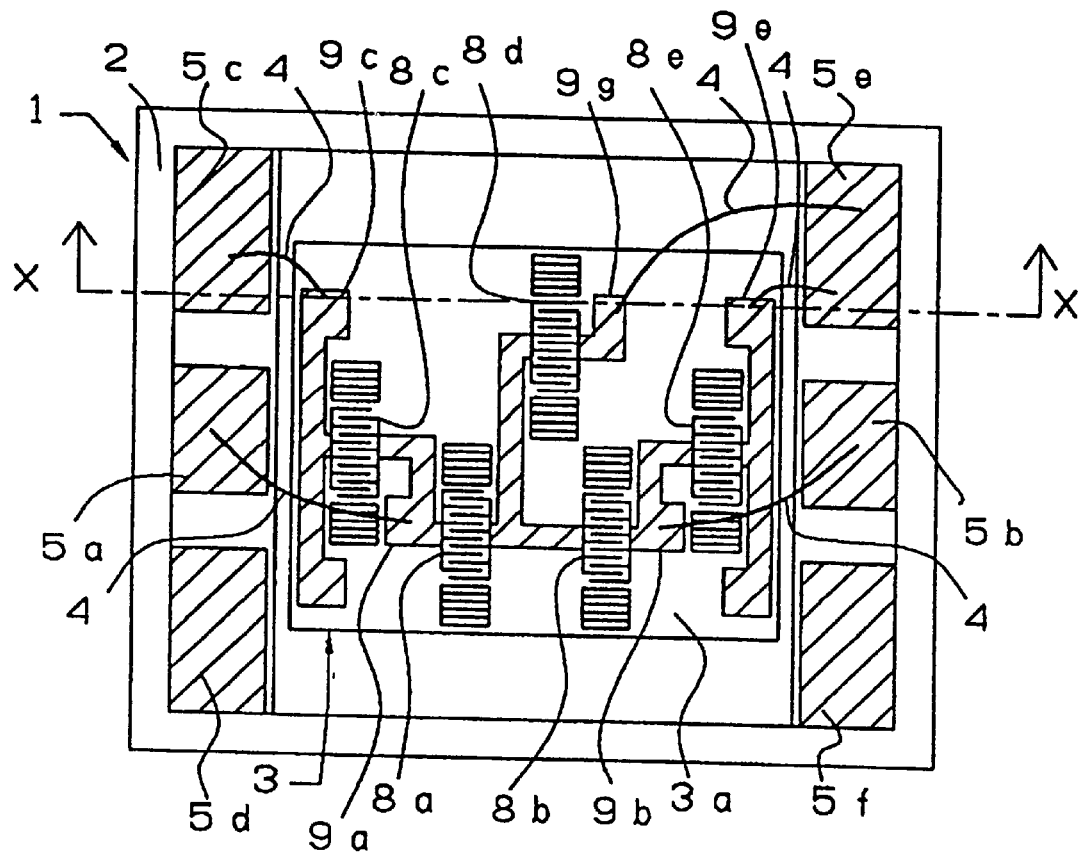
FIG. 1 is a plane view indicating a surface acoustic wave filter according to the first preferred embodiment of the present invention.
Figure 2:
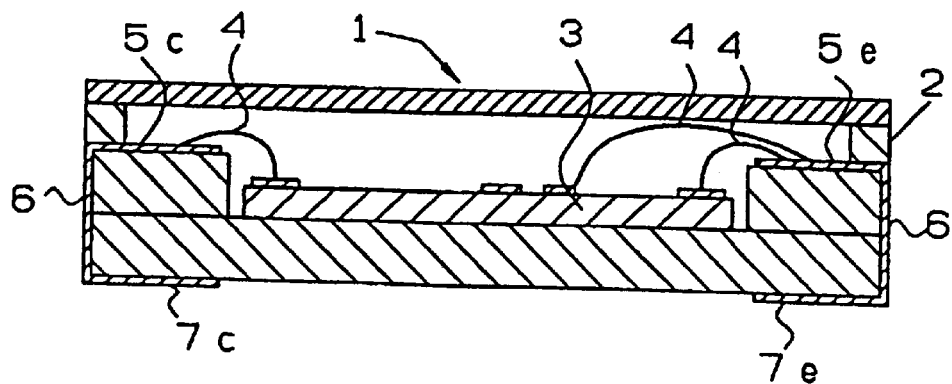
FIG. 2 is a cross sectional view taken along line X—X in FIG. 1.
Figure 3:
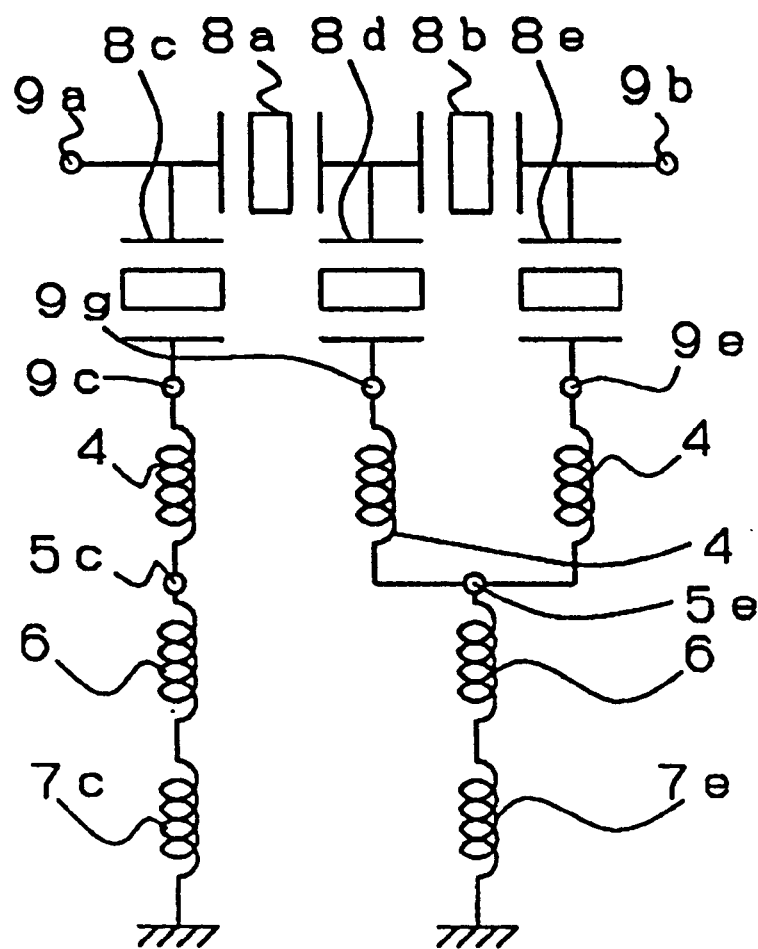
FIG. 3 is a diagram indicating an equivalent circuit for the surface acoustic wave filter of FIG. 1.
Figure 4:
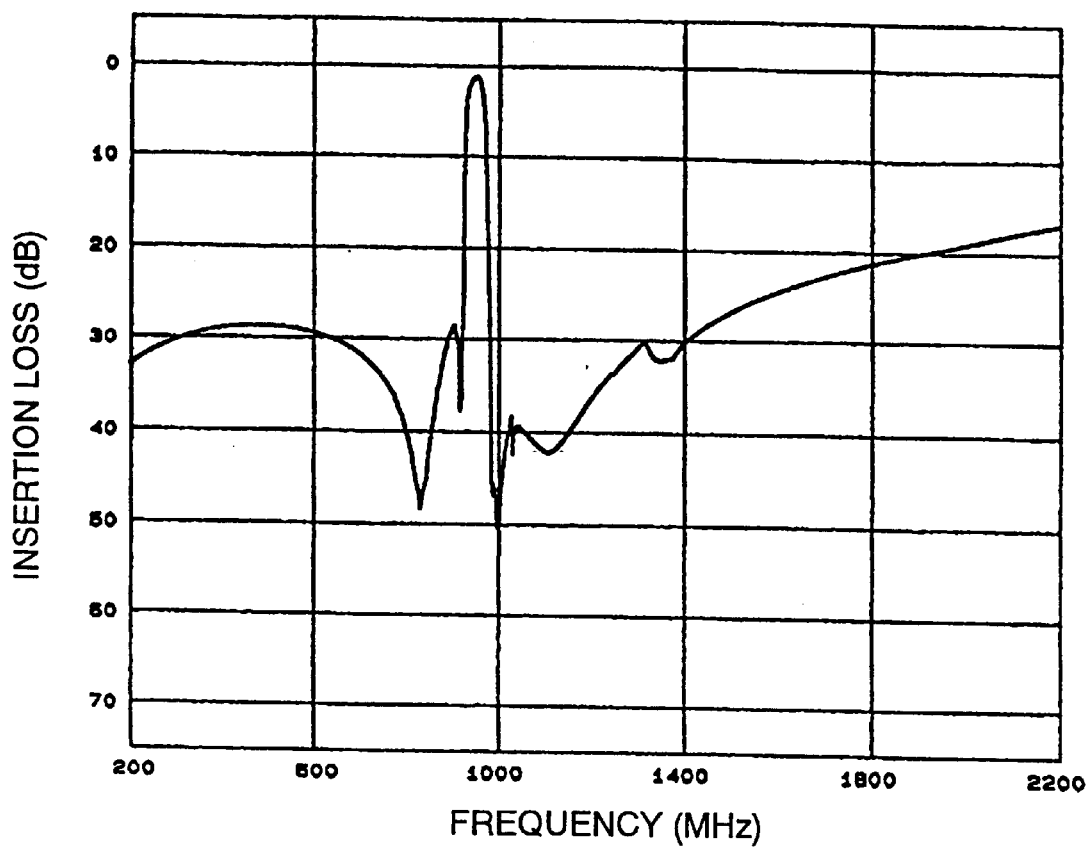
FIG. 4 is a graph indicating the frequency characteristic of the surface acoustic wave filter of FIG. 1.

In the following, a first preferred embodiment of the present invention will be described with reference to FIGS. 1 to 4. FIG. 1 is a plane view showing the internal structure of a surface acoustic wave filter with the lid removed, thus indicating the first preferred embodiment of the present invention. FIG. 2 is a cross sectional view taken along line X—X in FIG. 1. FIG. 3 is an equivalent circuit of FIG. 1. FIG. 4 is a graph indicating the frequency characteristics of FIG. 1.

As shown in FIG. 1, the surface acoustic wave filter 1 preferably includes a package 2 and a surface acoustic wave element 3 enclosed within the package 2, and bonding wires 4 for connecting the surface acoustic wave element 3.

The package 2 is preferably made of alumina or other suitable material, and is provided with a lid member. Within the package 2, input/output side electrode lands 5a and 5b, and reference potential side electrode lands 5c, 5d, 5e and 5f, are provided preferably by printing, sintering and plating treatments. Further, as shown in FIG. 2, the reference potential side electrode lands 5c and 5e are connected to input/output side external terminals 7c and 7e by way of coiled electrodes 6. Although not shown in the drawing, the input/output side electrode lands 5a and 5b are also connected to input/output side external terminals, similarly via the coiled electrodes. Moreover, the reference potential side lands 5d and 5f are connected to reference potential side external terminals similarly via the coiled electrodes.

The surface acoustic wave element 3 includes a piezoelectric substrate 3a, IDTs (Interdigital Transducer) 8a, 8b, 8c, 8d, 8e, input/output terminals 9a, 9b, and reference potential terminals 9c, 9e, 9g, all of which are disposed on the piezoelectric plate.

The piezoelectric substrate 3a can be made of quartz, LiTaO$_3$, LiNbO$_3$ or other suitable material. Alternatively, it is possible to use a piezoelectric substrate obtained by forming ZnO film on an insulating substrate such as a sapphire plate. Nevertheless, if a 36 degree-rotated Y-cut X-direction propagating LiTaO₃ substrate is used, a broad frequency band for the pass band is provided since it has a relatively high electromechanical coupling factor as compared with other materials.

IDTs 8a to 8e are respectively connected by virtue of transmitting lines, thereby forming a ladder type configuration as shown in FIG. 3. The IDTs 8a and 8b are disposed in series, while the IDTs 8c to 8e are disposed in parallel. Nevertheless, reflectors are disposed on both sides of the surface acoustic wave propagating direction of the IDTs 8a to 8e, thereby effectively confining or trapping the energy. However, in a case where the energy is sufficiently trapped, such as a case where there are many pairs of IDTs or where the surface acoustic waves are reflected at each end surface of the piezoelectric substrate, it is not necessary to include the reflectors. These IDTs 8a to 8e, the reflectors, transmitting lines, input/output terminals 9a and 9b, the reference potential terminals 9c, 9e, 9g are formed preferably by vapor depositing Al or a metal containing Al as its main component, and using a photolithography method.

Further, as shown in FIG. 1, the input/output terminal 9a is connected to an input/output electrode land 5a of the package 2 via a wire 4, while the input/output terminal 9b is connected to an input/output electrode land 5b of the package 2 via a wire 4. The reference potential terminal 9c is connected to a reference potential side electrode land 5c of the package 2 via a wire 4, while the reference potential terminal 9g is connected to an input/output side electrode land 5e of the package 2 via a wire 4, and the reference potential terminal 9e is connected to an input/output side electrode land 5e of the package 2 via a wire 4. However, the reference potential side electrode lands 5d and 5f of the package 2 are not connected to the surface acoustic wave element 3, but exist as floating electrode lands.

The frequency characteristic of the surface acoustic wave filter having the structure is shown in FIG. 4. In this example, IDT 8a has an electrode length of about 32 μm and 80 pairs, IDT 8b has an electrode length of about 32 μm and 80 pairs, IDT 8c has an electrode length of about 88 μm and 72 pairs, IDT 8d has an electrode length of about 117 μm and 116 pairs, IDT 8e has an electrode length of about 88 μm and 72 pairs. Further, an inductance from the reference potential terminal 9c to the reference potential is preferably about 0.6 nH, an inductance from the reference potential terminal 9g to the reference potential is preferably about 0.8 nH, an inductance from the reference potential terminal 9e to the reference potential is preferably about 0.6 nH.

The surface acoustic wave filter is adapted to define a receiving side RF filter for use in GSM, and its center frequency is preferably about 947.5 MHz, as shown in FIG. 4. When used in GSM, since the frequency of an intermediate frequency signal is usually about 71 MHz, a center frequency of an image frequency signal causing a problem in a communications apparatus will occur at about 1089.5 MHz (947.5 MHz+2×71 MHz), for example. As shown in FIG. 4, it is understood that the surface acoustic wave filter includes a trap in the vicinity of about 1100 MHz, thereby obtaining an attenuating effect which at this point will be effectively as large as about 42 dB. Such a trap is coincident with a resonance frequency of a resonator having capacities of IDTs 8c, 8d, 8e arranged in parallel with one another, and having inductance from the reference potential terminals 9c, 9g, 9e to the reference potential. Further, if the trap is in the vicinity of the center frequency of the image frequency signal, since an attenuating amount in this vicinity is improved, it is not necessary to have the trap be coincident with the center frequency of the image frequency signal. However, in view of an attenuating amount in the vicinity of the trap, it is desired that the frequency of the trap be controlled within a range of about 5% of the center frequency of the image frequency signal.

In recent years, people have been considering the GSM using the surface acoustic wave filter, and considering with the EGSM how the intermediate frequency signal can be made to have a high frequency. If such an intermediate frequency signal has a high frequency, the image frequency signal will also become high.

Figure 5:
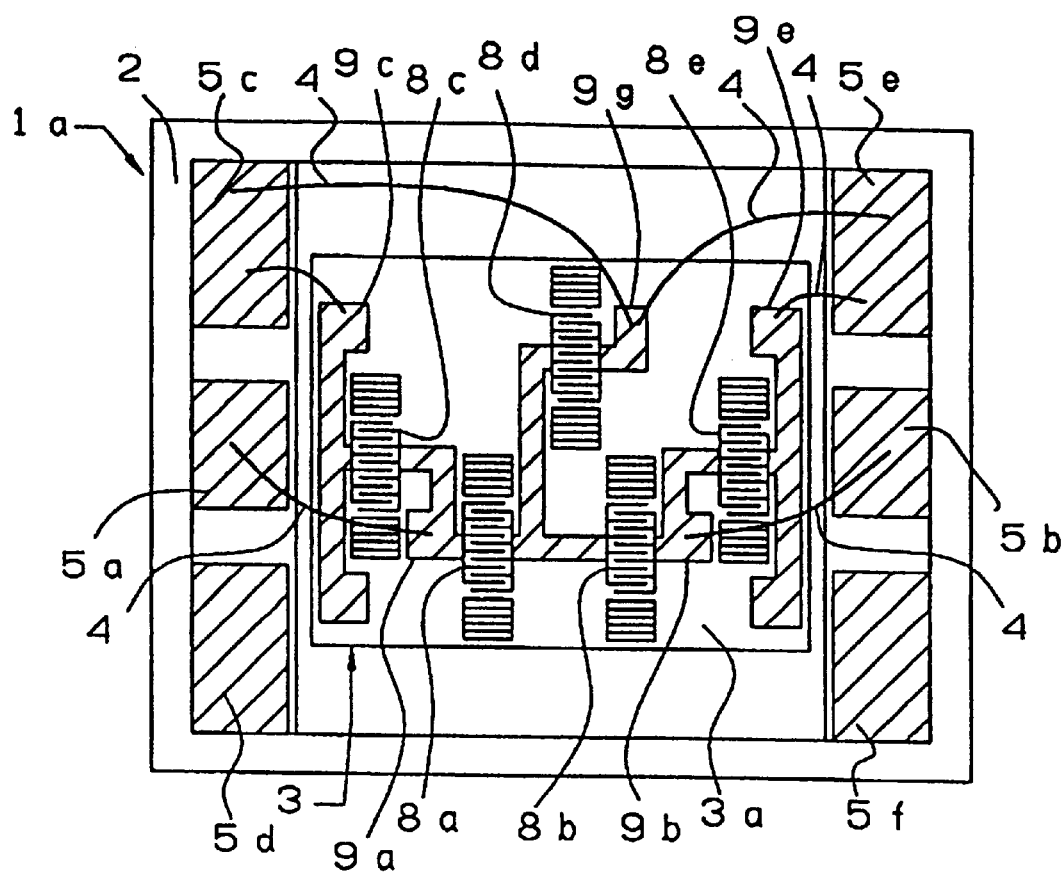
FIG. 5 is a plane view indicating a surface acoustic wave filter according to a first modification of the first preferred embodiment of the present invention.
Figure 6:
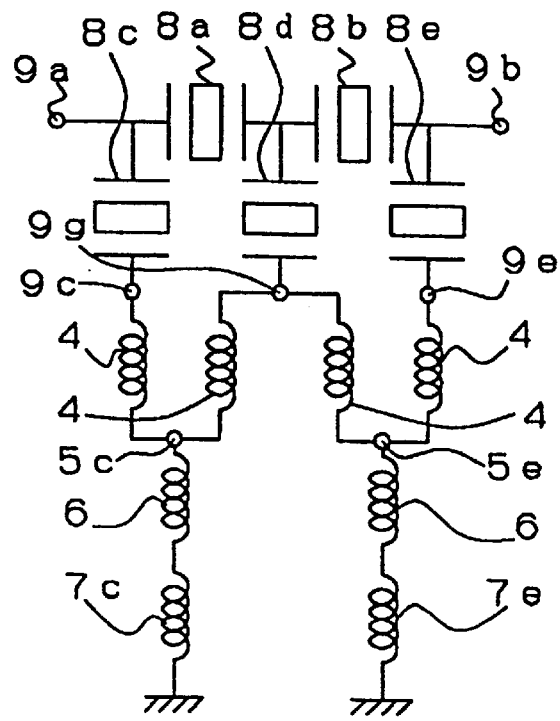
FIG. 6 is a diagram indicating an equivalent circuit for the surface acoustic wave filter of FIG. 5.

For this reason, a surface acoustic wave filter 1a was manufactured as shown in FIG. 5. One difference between the surface acoustic wave filter 1a and the surface acoustic wave filter 1 shown in FIG. 1 is that the former includes a bonding wire 4 for connecting the reference potential terminal 9g of the surface acoustic wave element 3 with the reference potential side land 5c of the package 2. In this way, as shown in an equivalent circuit of FIG. 6, there an inductance is caused by a path defined by a bonding wire 4, a coiled electrode 6 and a reference potential side external terminal 7e, which inductance is added to the reference potential terminal 9g connected with the IDT 8d disposed on a center parallel arm. Another inductance added and formed in parallel with the inductance is caused by a path defined by another bonding wire 4, another coiled electrode 6 and another reference potential side external terminal 7c. For this reason, an inductance from the reference potential terminal 9g to the reference potential will become smaller than that of the surface acoustic wave filter 1 shown in FIG. 1. Therefore, the resonance frequency of the resonator having a capacity of the IDT 8d and having an inductance from the reference potential terminal 9g to the reference potential, will become higher than that of the surface acoustic wave filter 1. Further, even with the reference potential terminal 9c connected similarly with the IDT 8c, an inductance from the reference potential terminal 9c to the reference potential will also become small as compared with the surface acoustic wave filter 1 shown in FIG. 1. Accordingly, the resonance frequency of the resonator having a capacity of the IDT 8c and having an inductance from the reference potential terminal 9c to the reference potential, will become high as compared with the surface acoustic wave filter 1.

Figure 7:
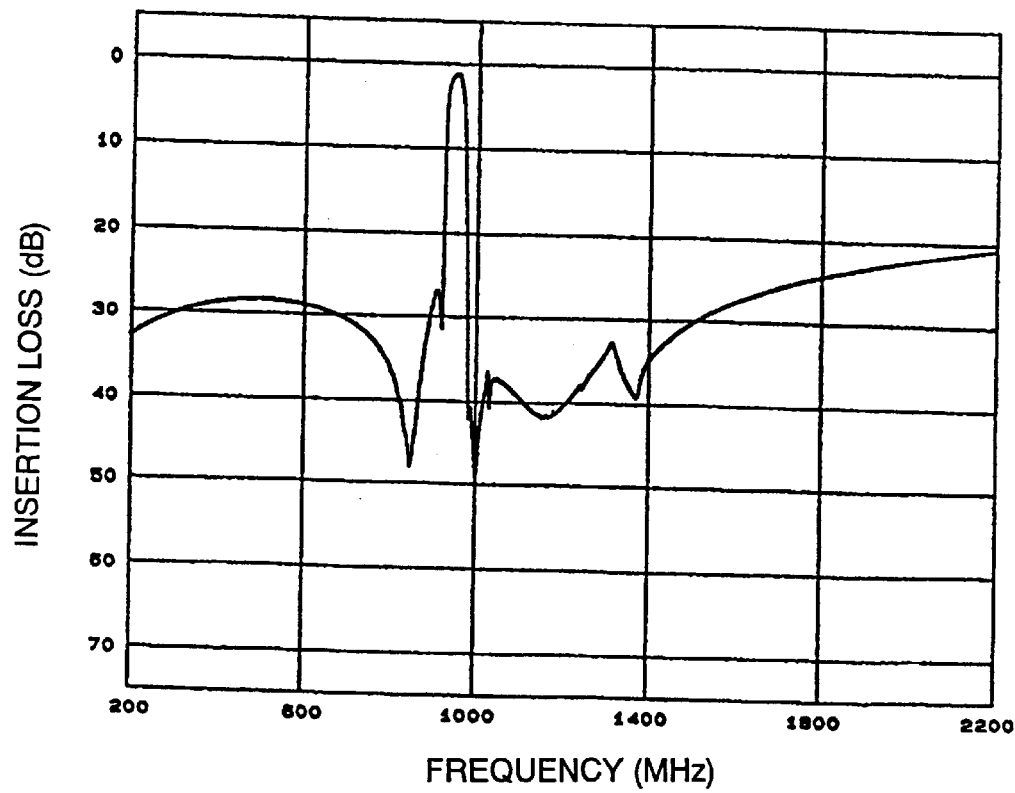
FIG. 7 is a graph indicating the frequency characteristic of the surface acoustic wave filter of FIG. 5.

FIG. 7 is used to indicate a frequency characteristic of the surface acoustic wave filter 1a. In this example, the IDTs 8a to 8e preferably include the same elements as used in the surface acoustic wave filter having the electrode length, number of pairs and the center frequency as shown in FIG. 4. Further, an inductance from the reference potential terminal 9c to the reference potential is about 0.3 nH, an inductance from the reference potential terminal 9g to the reference potential is about 0.4 nH, an inductance from the reference potential terminal 9e to the reference potential is about 0.3 nH.

As shown in FIG. 7, it is understood that the surface acoustic wave filter includes a trap in the vicinity of about 1170 MHz and that an attenuating amount at this point has been effectively increased to as high as about 42 dB. Therefore, it is possible to cope with a center frequency 110 MHz of the intermediate frequency signal.

Figure 8:
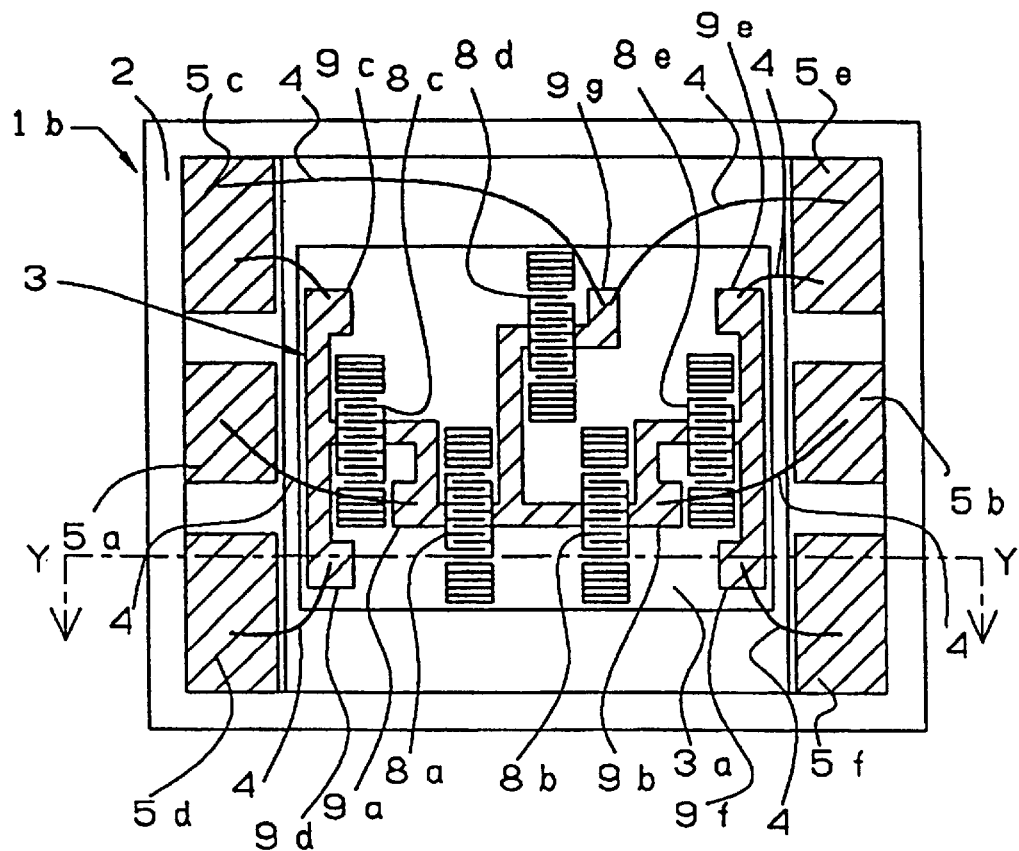
FIG. 8 is a plane view indicating a surface acoustic wave filter made according to a second modification of the first preferred embodiment of the present invention.
Figure 9:
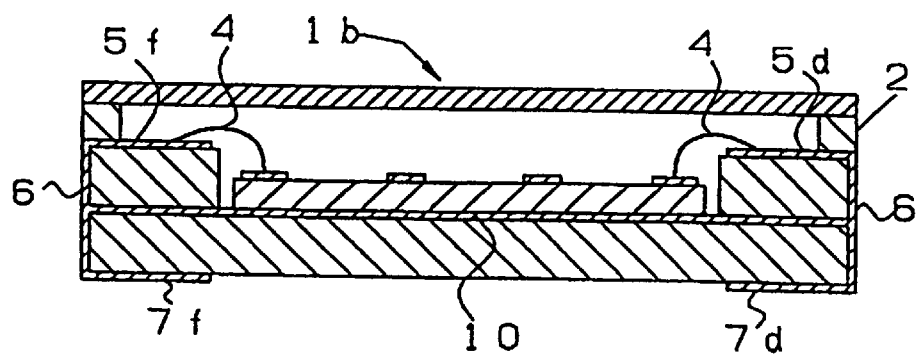
FIG. 9 is a cross sectional view taken along line Y—Y in FIG. 8.

Next, as an example of obtaining a further higher frequency, a surface acoustic wave filter 1b was manufactured as shown in FIG. 8. One difference between the surface acoustic wave filter 1b and the surface acoustic wave filter 1a shown in FIG. 5 is that the former is provided with a bonding wire 4 for connecting the reference potential terminal 9d of the surface acoustic wave element 3 with the reference potential side land 5d of the package 2, and there is provided another bonding wire 4 for connecting the reference potential terminal 9f of the surface acoustic wave element 3 with the reference potential side land 5f of the package 2. Further, as shown in FIG. 9, on the bottom surface of the package 2, a die-attach section 10 is provided and arranged to be connected to the coiled electrodes 6.

Figure 10:
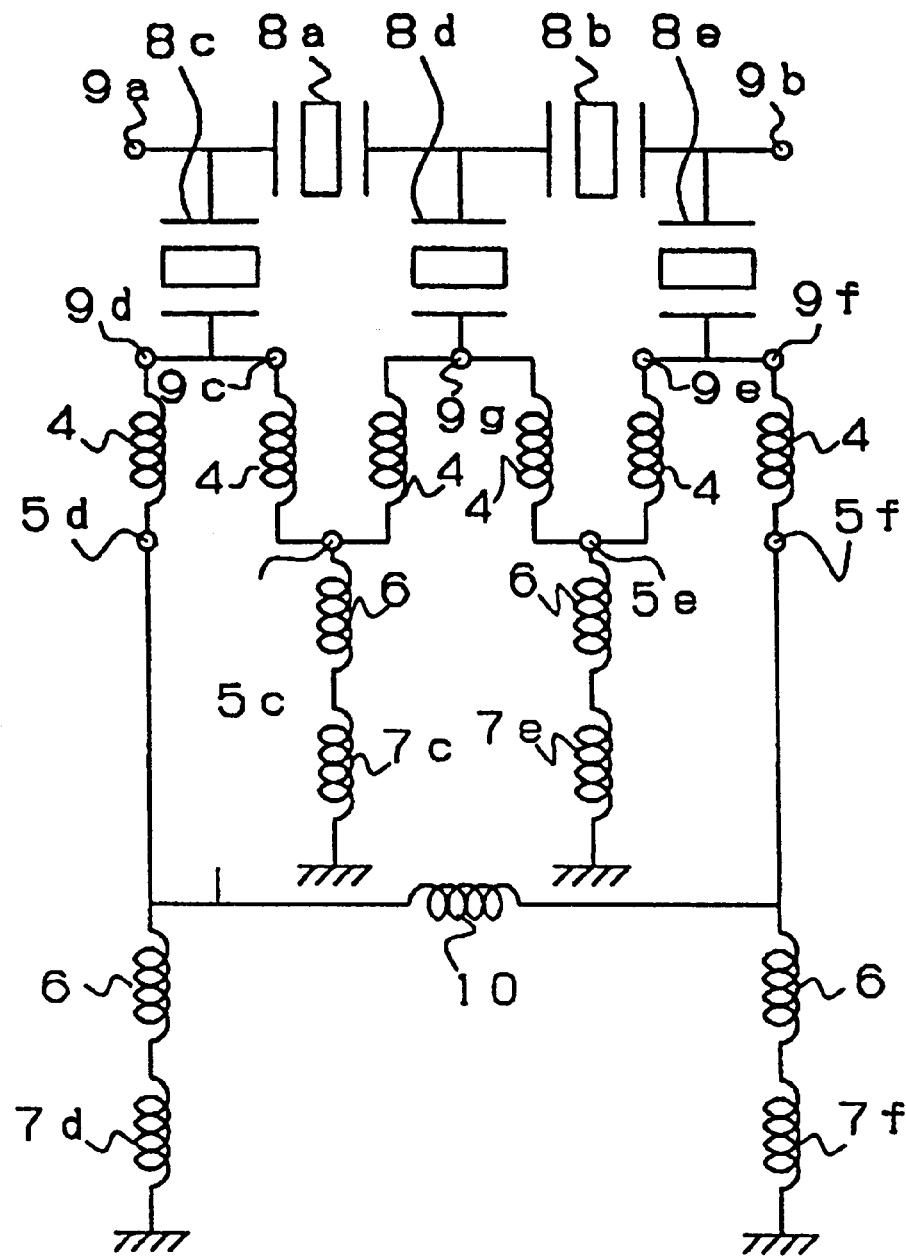
FIG. 10 is a diagram indicating an equivalent circuit for the surface acoustic wave filter of FIG. 8.

In this way, as shown in an equivalent circuit of FIG. 10, an inductance is caused by a path defined by a bonding wire 4, a coiled electrode 6 and a reference potential side external terminal 7d, which inductance is added in parallel to the reference potential terminal 9d connected with the IDT 8c. Further, an inductance is caused by a path defined by another bonding wire 4, another coiled electrode 6 and a reference potential side external terminal 7f, which inductance is added in parallel to the reference potential terminal 9d connected with the IDT 8e.

Further, since the two paths are connected with the die-attach section 10, the inductances which are in parallel with each other and are connected with IDTs 8c to 8e will become small. As a result, the resonance frequency of the resonator having capacities of the IDTs 8c and 8e and having inductances connected therewith respectively, will become high.

Figure 11:
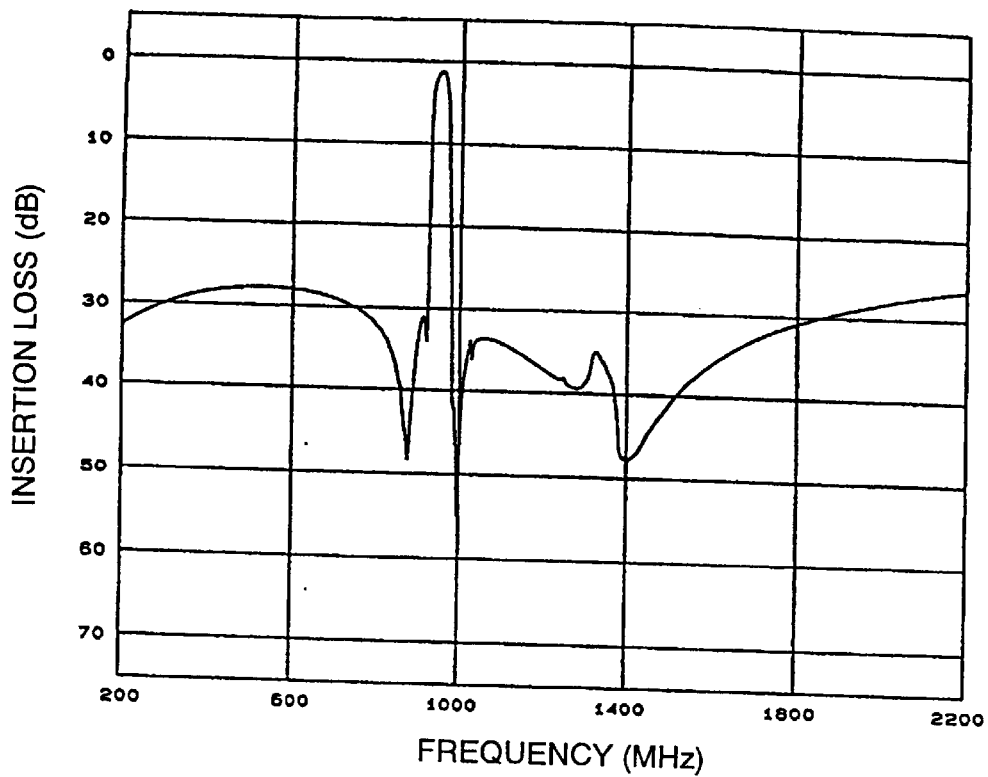
FIG. 11 is a graph illustrating the frequency characteristic of the surface acoustic wave filter of FIG. 8.

With the surface acoustic wave filter 1b, as shown in FIG. 11, a trap is defined in the vicinity of about 1400 MHz, and an attenuating amount at this point has been effectively increased to as high as about 47 dB. Therefore, it is possible to cope with a center frequency 220 MHz of the intermediate frequency signal.

Therefore, when the center frequency of an intermediate frequency signal of a communications apparatus is, for example, about 220 MHz, the elastic surface acoustic filter 1 shown in FIG. 1 has an attenuating amount of about 30 dB in the vicinity of about 1400 MHz, while the surface acoustic wave filter 1b shown in FIG. 8 achieves an attenuating amount of about 47 dB in the vicinity of about 1400 MHz, thereby ensuring that the attenuating amount may be further improved by about 17 dB Next, a second preferred embodiment of the present invention will be described.

The second preferred embodiment reduces the capacities of the IDTs 8c to 8e disposed on the parallel arms of the surface acoustic wave filter 1 which has been described with reference to FIG. 1, so as to increase the frequency of the resonator having the capacities of the IDTs 8c to 8e and the inductances connected therewith. However, as a method of reducing the capacities of the IDTs 8c to 8e, it is possible to reduce intersection width or to reduce the number of pairs.

Figure 12:
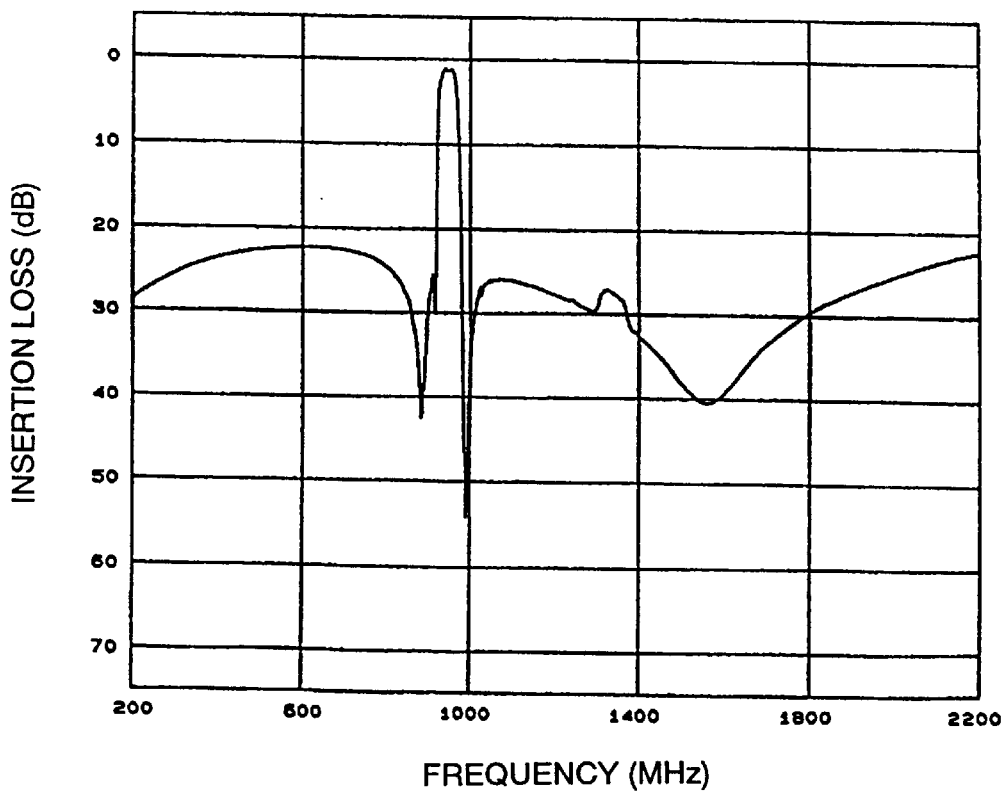
FIG. 12 is a graph illustrating the frequency characteristic of a surface acoustic wave filter made according to the second preferred embodiment of the present invention.

FIG. 12 shows some measurement results indicating the characteristics of the surface acoustic wave filter 1 of FIG. 1, under a condition where the capacities of the IDTs 8c and 8e have been reduced by about 20%, while the capacity of the IDT 8d has been reduced by about 40%. Since such a surface acoustic wave filter is arranged to define an RF filter on the receiving side for use in GSM, its center frequency is about 947.5 MHz, as shown in FIG. 12. In this example, a trap is provided in the vicinity of about 1560 MHz, and it is understood that an attenuating amount at this point has been effectively increased to as high as about 40 dB. Therefore, with the use of the surface acoustic wave filter of preferred embodiments of the present invention, it is possible to cope with a frequency 300 MHz of an intermediate frequency signal, thus making it possible to achieve an even higher frequency for the intermediate frequency signal, which is higher than that of the surface acoustic wave filter described in the first preferred embodiment.

Figure 13:
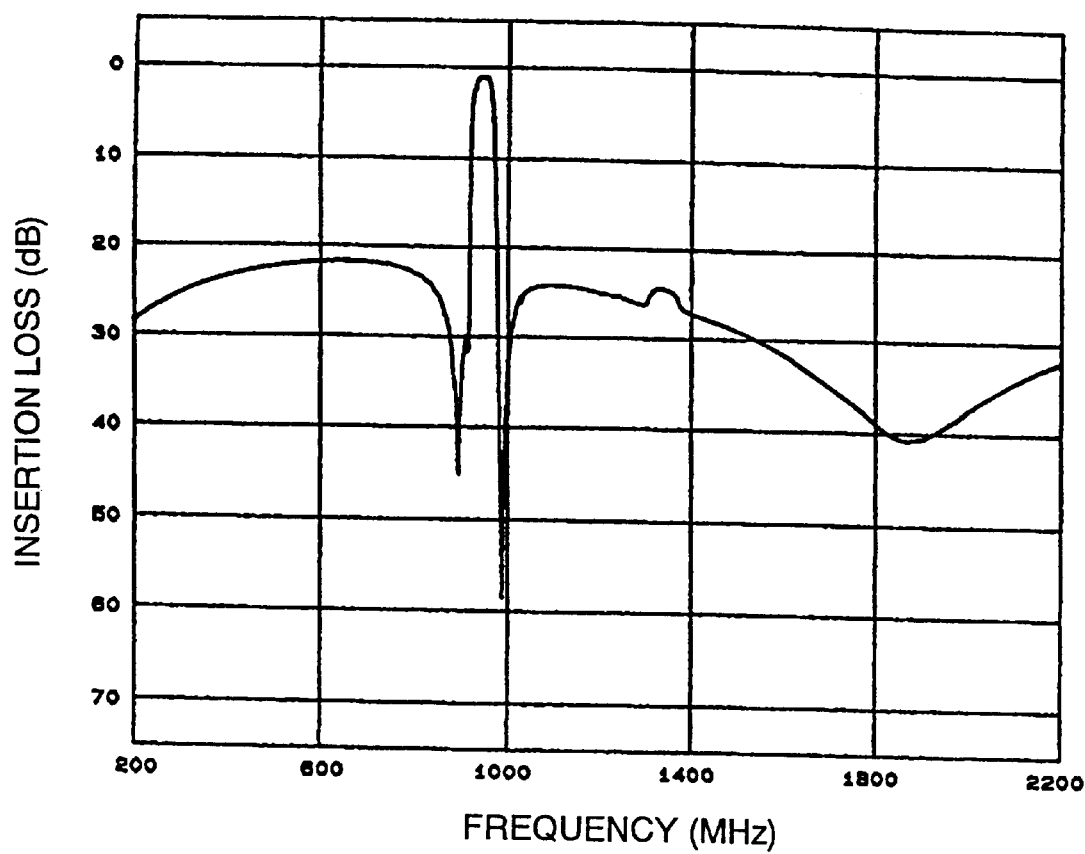
FIG. 13 is a graph illustrating the frequency characteristic of a surface acoustic wave filter made according to a first modification of the second preferred embodiment of the present invention.

Further, similar to the first preferred embodiment, it is also possible to expect an even higher frequency for the intermediate frequency signal, depending upon the number of the bonding wires used. FIG. 13 shows some measurement results indicating the characteristics of the surface acoustic wave filter 1b of FIG. 8, under a condition where the capacities of the IDTs 8c and 8e have been reduced by about 20% while the capacity of the IDT 8d has been reduced by about 40%. In this surface acoustic wave filter, a trap is provided in the vicinity of about 1870 MHz, and since an attenuating amount at this point has been effectively increased to as high as about 42 dB, it is possible to cope with a center frequency 460 MHz of an intermediate frequency signal.

For this reason, if the first preferred embodiment and the second preferred embodiment are combined together, with the intermediate frequency signal in a range of about 71 to about 460 MHz, it is possible to effectively improve an attenuating amount for the image frequency signal.

However, similar to the first preferred embodiment, if such a trap is provided in the vicinity of the center frequency of the image frequency signal, the trap improves an attenuating amount in the vicinity, thus allowing the trap not to be coincident with the center frequency of the image frequency signal. Nevertheless, in view of an attenuating extent in the vicinity of a trap, it is desired that the frequency of a trap is within about 5% of the center frequency of an image frequency signal.

Figure 14:
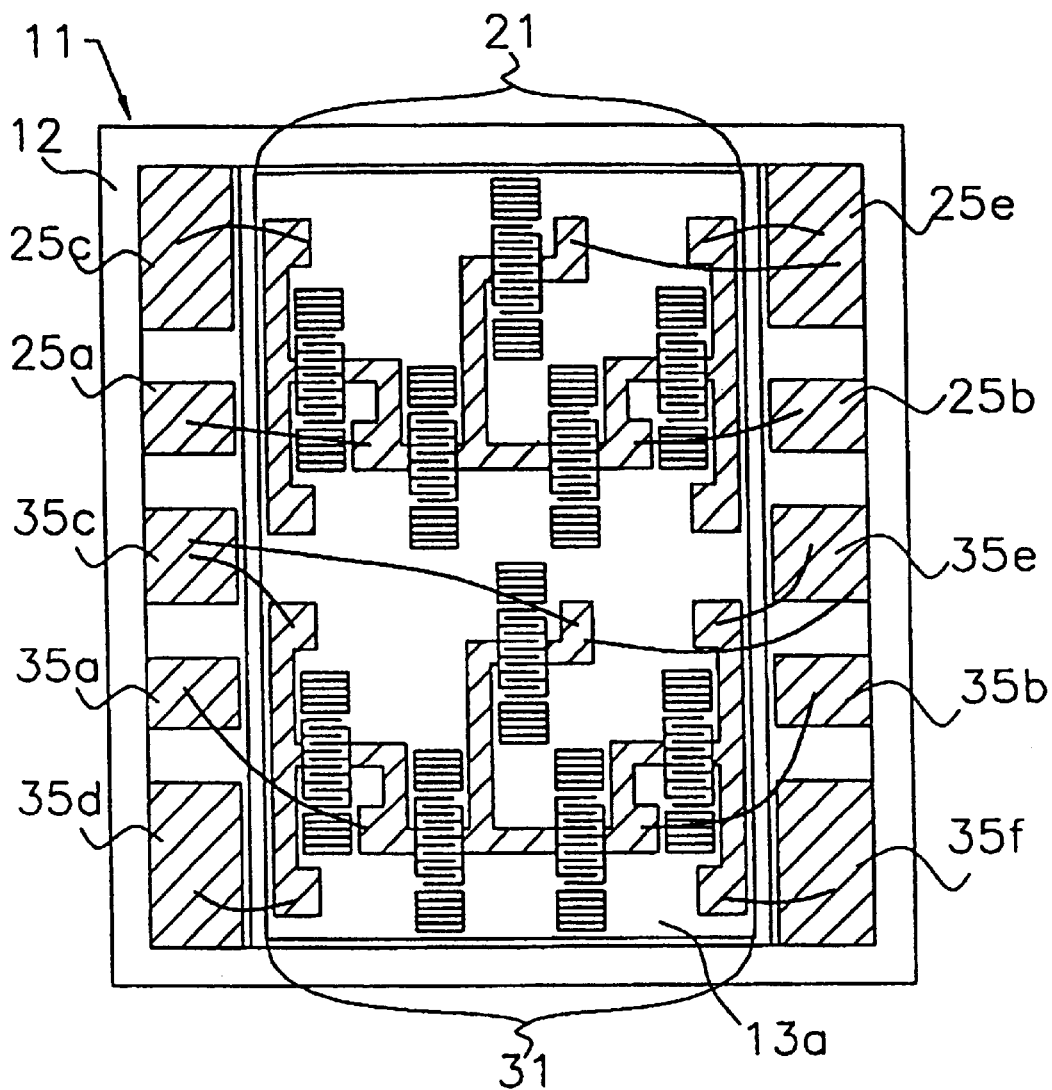
FIG. 14 is a plane view illustrating a surface acoustic wave filter made according to the third preferred embodiment of the present invention.

Next, the third preferred embodiment of the present invention will be described with reference to FIG. 14. FIG. 14 is a plane view showing the internal structure of a surface acoustic wave filter with the lid removed, thereby illustrating a third preferred embodiment of the present invention.

As shown in FIG. 14, in the present preferred embodiment, a dual-band surface acoustic wave filter 11 preferably includes two band pass filters 21 and 31 having different center frequencies. Thus, the filter 11 includes a package 12 and a piezoelectric substrate 13a enclosed within the package, and bonding wires for connecting the package 12 with the terminals on the piezoelectric substrate 13a.

The package 12 is preferably made of alumina and has a lid which is not shown in the drawing. Further, within the package 12, input/output side electrode lands 25a, 25b, 35a, 35b, and reference potential side electrode lands 25c, 25e, 35c to 35f, are provided and are preferably formed via printing, sintering and plating treatments. Further, similar to the package of the surface acoustic wave filter described in the first preferred embodiment, input/output side electrode lands 25a, 25b, 35a, 35b and the reference potential side electrode lands 25c, 25e and 35c to 35f are respectively connected to the external terminals via coiled electrodes.

On a piezoelectric substrate 13a, a plurality of IDTs, a plurality of input/output terminals and reference potential terminals are provided and arranged to define two surface acoustic wave elements, thus providing band pass filters 21 and 31, respectively.

Figure 15:
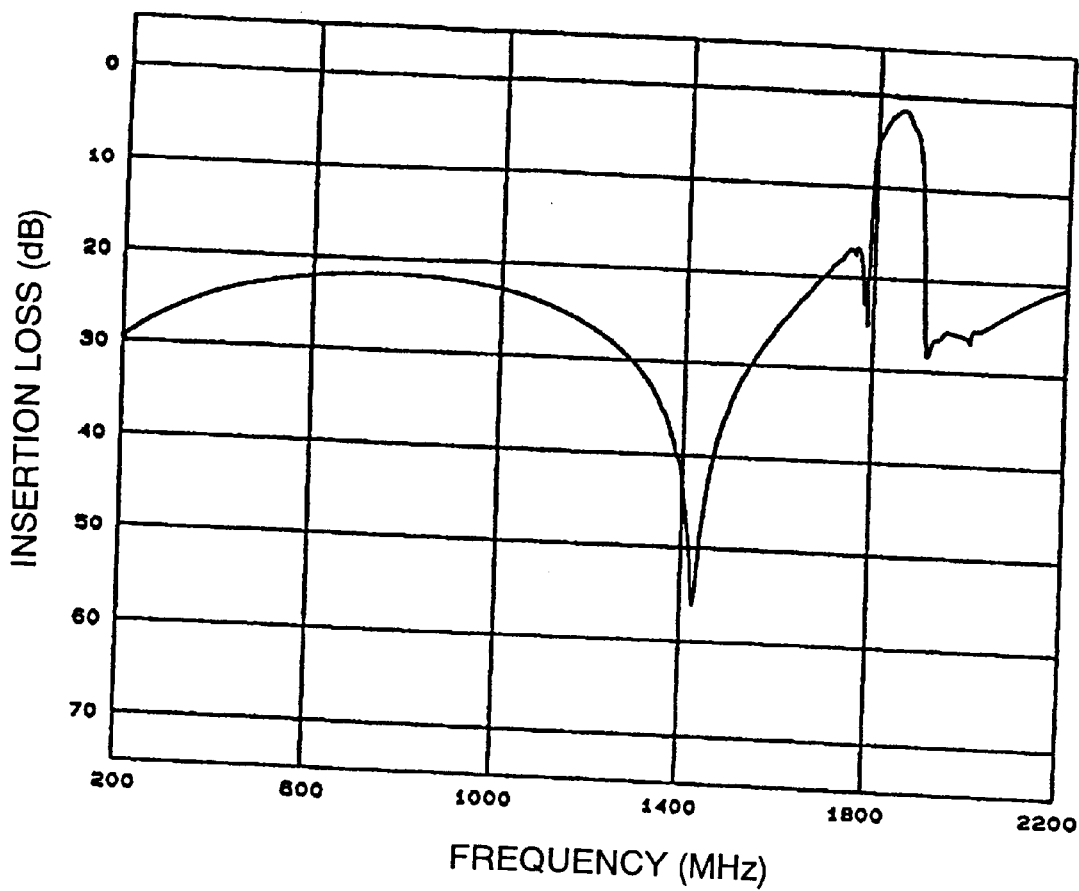
FIG. 15 is a graph indicating a frequency characteristic of a first band pass filter 21 of FIG. 14.

The band pass filter 21 preferably has the same structure as that shown in the equivalent circuit of FIG. 3, with its center frequency being set at about 1842.5 MHz. In this band pass filter 21, as shown in FIG. 15, the resonance frequency of a resonator having the capacities of the IDTs disposed on a plurality of parallel arms and having the inductance extending to the reference potential terminals connected therewith, is in the vicinity of about 1430 MHz.

Accordingly, when the center frequency of the intermediate frequency signal is about 220 MHz, the image frequency is 1402.5 MHz (1842.5 MHz−2×220 MHz), and it is possible to obtain an attenuating amount of about 40 dB or more. In this way, the capacities of the IDTs and the inductances extending to the reference potential terminals connected therewith may be set, thereby making it possible to cope with the image frequency on the low frequency band side of the pass band.

The band pass filter 31 has the same structure as that shown in the equivalent circuit of FIG. 10, with its center frequency being set at 947.5 MHz. In this band pass filter 31, as shown in FIG. 11, the resonance frequency of a resonator having the capacities of the IDTs disposed on a plurality of parallel arms and having the inductance extending until the reference potential terminals connected therewith, is set so as to be in the vicinity of 1400 MHz. Accordingly, when the center frequency of the intermediate frequency signal is about 220 MHz, the image frequency is 1387.5 MHz (947.5 MHz−2×220 MHz), and it is possible to obtain an attenuating amount of about 47 dB or more.

In the described dual-band surface acoustic wave filter, a frequency difference fd1 between the center frequency and the image frequency in the first surface acoustic wave filter is preferably approximately equal to a frequency difference fd2 between the center frequency and the image frequency in the second surface acoustic wave filter, thereby rendering the intermediate frequency signals thereof to be 220 MHz. For this reason, it is possible to make common the circuits for signal processing from the intermediate frequency signals onward.

However, in the present preferred embodiment, although the band pass filters 21 and 31 are provided on the identical piezoelectric substrate 13a, the present invention is not so limited. It is also possible that the band pass filters 21 and 31 may be provided on different piezoelectric substrates. If the filters are disposed on the identical piezoelectric substrate, it is possible to reduce the number of steps in a manufacturing process, reduce the manufacturing cost and product size. However, if it is desired to make the characteristics of the band pass filters 21 and 31 significantly different, it is preferred to use different piezoelectric substrates.

Figure 16:
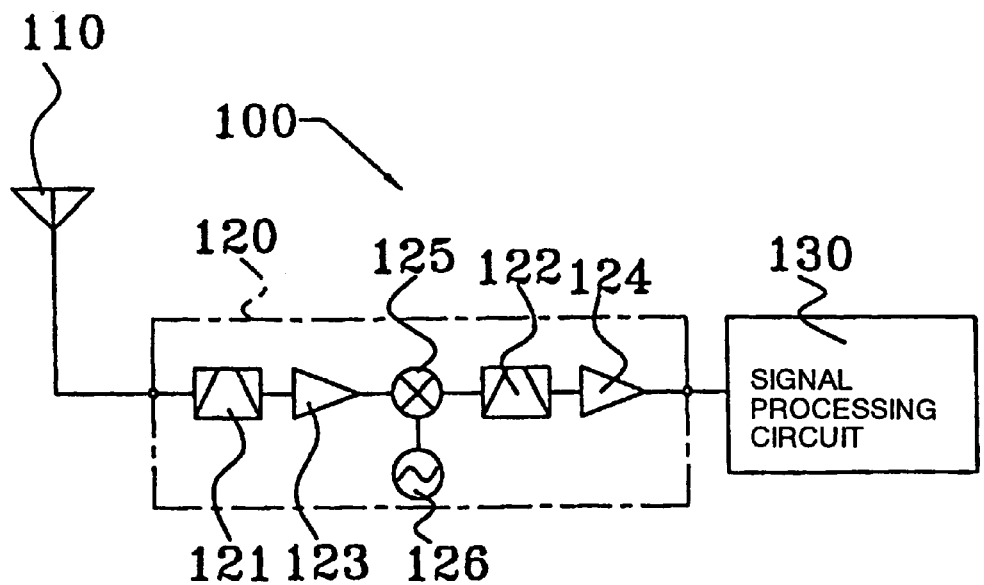
FIG. 16 is a block diagram indicating a communications apparatus for use in a superheterodyne system.

Further, the surface acoustic wave filters described in the first to third preferred embodiments of the present invention are those which may be used in a communications apparatus shown in FIG. 16. The resonance frequency of a trap resonator having the capacities of the IDTs and inductance extending from the IDTs to the reference potential may be changed properly in accordance with an image frequency which is to be attenuated.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter comprising:
    at least one surface acoustic wave element including a piezoelectric substrate having at least one IDT, input/output terminals and reference potential terminals provided thereon, the input/output terminals and the reference potential terminals being connected to said at least one IDT;
    a package enclosing the at least one surface acoustic wave element, the package having electrode lands respectively connected to the input/output terminals and the reference potential terminals of the at least one surface acoustic wave element, further having external terminals connecting the electrode lands on the outer surface thereof; wherein
    said surface acoustic wave filter is adapted and arranged to be used in a superheterodyne system; and
    the resonance frequency of a resonator having the capacity of the at least one IDT of the at least one surface acoustic wave element and having inductances from the reference potential terminals of the at least one surface acoustic wave element to the external terminals of the package, is positioned in the vicinity of an image frequency occurring at the time of performing frequency conversion in the superheterodyne system.

2. The surface acoustic wave filter according to claim 1, wherein inductances from the reference potential terminals of the at least one surface acoustic wave element to the external terminals of the package, include inductances of bonding wires connecting the reference potential terminals of the at least one surface acoustic wave element with the electrode lands of the package.

3. The surface acoustic wave filter according to claim 1, wherein inductances from the reference potential terminals of the at least one surface acoustic wave element to the external terminals of the package, include inductances of strip lines provided on the piezoelectric substrate.

4. The surface acoustic wave filter according to claim 1, wherein inductances from the reference potential terminals of the at least one surface acoustic wave element to the external terminals of the package, include inductances of strip lines disposed on the package.

5. A communications apparatus comprising a surface acoustic wave filter according to claim 1.

6. A surface acoustic wave filter comprising:
    at least one surface acoustic wave element including a piezoelectric substrate having input/output terminals, reference potential terminals, in-series arm IDTs between the input/output terminals, and in-parallel arm IDTs between the in-series arm IDTs and the reference potential terminals arranged to define a ladder circuit;
    a package enclosing the at least one surface acoustic wave element, the package having electrode lands respectively connected with the input/output terminals and the reference potential terminals of the at least one surface acoustic wave element, further having external terminals connecting the electrode lands on the outer surface thereof; wherein
    said surface acoustic wave filter is adapted and arranged to be used in a superheterodyne system; and
    the resonance frequency of a resonator having the capacities of the in-parallel arm IDTs and having inductances from the reference potential terminals of the at least one surface acoustic wave element to the external terminals of the package, is positioned in the vicinity of an image frequency occurring at the time of performing frequency conversion in the superheterodyne system.

7. The surface acoustic wave filter according to claim 6, wherein inductances from the reference potential terminals of the at least one surface acoustic wave element to the external terminals of the package, include inductances of bonding wires connecting the reference potential terminals of the at least one surface acoustic wave element with the electrode lands of the package.

8. The surface acoustic wave filter according to claim 6, wherein inductances from the reference potential terminals of the at least one surface acoustic wave element to the external terminals of the package, include inductances of strip lines provided on the piezoelectric substrate.

9. The surface acoustic wave filter according to claim 6, wherein inductances from the reference potential terminals of the at least one surface acoustic wave element to the external terminals of the package, include inductances of strip lines disposed on the package.

10. A communications apparatus comprising a surface acoustic wave filter according to claim 6.

11. A surface acoustic wave filter comprising:
a plurality of surface acoustic wave elements;
a package enclosing the plurality of surface acoustic wave elements; wherein
said filter is adapted to be used in a superheterodyne system in which the center frequency of at least one of the plurality of surface acoustic wave elements is different from the center frequency of another of the plurality of surface acoustic wave elements; and, characterized in that:
a frequency difference fd1 between the center frequency of the at least one of the plurality of surface acoustic wave elements and the image frequency occurring at a time of performing frequency conversion in a corresponding superheterodyne system is approximately equal to a frequency difference fd2 between the center frequency of said another of the plurality of surface acoustic wave elements and the image frequency occurring at a time of performing frequency conversion in a corresponding superheterodyne system.

12. The surface acoustic wave filter according to claim 11, wherein at least one of the plurality of surface acoustic wave elements includes a piezoelectric substrate having at least one IDT, input/output terminals and reference potential terminals, the input/output terminals and the reference potential terminals being connected to the at least one IDT;
the package encloses the plurality of surface acoustic wave elements and has electrode lands connected respectively with the input/output terminals and the reference potential terminals of the plurality of surface acoustic wave elements, and includes external terminals connecting the electrode lands on the outer surface thereof;
the resonance frequency of a resonator has a capacity of an IDT of any of the plurality of surface acoustic wave elements and has an inductance from a reference potential terminal of any of the plurality of surface acoustic wave elements to the external terminals of the package, and is positioned in the vicinity of an image frequency occurring at a time of performing frequency conversion in a superheterodyne system.

13. The surface acoustic wave filter according to claim 12, wherein inductances from the reference potential terminals of the plurality of surface acoustic wave elements to the external terminals of the package, include inductances of bonding wires connecting the reference potential terminals of the plurality of surface acoustic wave elements with the electrode lands of the package.

14. The surface acoustic wave filter according to claim 12, wherein inductances from the reference potential terminals of the plurality of surface acoustic wave elements to the external terminals of the package, include inductances of strip lines provided on the piezoelectric substrate.

15. The surface acoustic wave filter according to claim 12, wherein inductances from the reference potential terminals of the plurality of surface acoustic wave elements to the external terminals of the package, include inductances of strip lines disposed on the package.

16. The surface acoustic wave filter according to claim 11, wherein any one of the plurality of surface acoustic wave elements includes a piezoelectric substrate having input/output terminals, reference potential terminals, in-series arm IDTs between the input/output terminals, in-parallel arm IDTs between the in-series arm IDTs and the reference potential terminals which are arranged to define a ladder circuit;
the package encloses the plurality of surface acoustic wave elements, has electrode lands connected respectively with the input/output terminals and the reference potential terminals of the plurality of surface acoustic wave elements, and includes external terminals connecting the electrode lands on the outer surface thereof;
the resonance frequency of a resonator has a capacity of an in-parallel IDT of any of the plurality of surface acoustic wave elements and has an inductance from a reference potential terminal of any of the plurality of surface acoustic wave elements to the external terminals of the package, and is positioned in the vicinity of an image frequency occurring at the time of performing frequency conversion in a surperheterodyne system.

17. A communications apparatus comprising a surface acoustic wave filter according to claim 11.

18. A surface acoustic wave filter comprising:
a surface acoustic wave element including a piezoelectric substrate having at least one IDT, input/output terminals and reference potential terminals, the input/output terminals and the reference potential terminals being connected by said at least one IDT;
a package enclosing the surface acoustic wave element and having electrode lands connected respectively with the input/output terminals and the reference potential terminals of the surface acoustic wave element, the package further having external terminals connecting the electrode lands on the outer surface thereof;
bonding wires connecting the reference potential terminals of the surface acoustic wave element with the electrode lands of the package; wherein
said surface acoustic wave filter is adapted and arranged for use in a superheterodyne system; and
the capacity of the at least one IDT, the number of bonding wires connected with the reference potential terminals, the number of electrode lands connected with the reference potential terminals through the bonding wires, the connecting positions of the bonding wires corresponding to the reference potential terminals and the electrode lands are set such that the resonance frequency of a resonator having the capacities of IDTs of the surface acoustic wave element and having inductances from the reference potential terminals of the surface acoustic wave element to the external terminals of the package, is positioned in the vicinity of an image frequency occurring at the time of performing frequency conversion in the superheterodyne system.

19. A surface acoustic wave filter, comprising:
at least one surface acoustic wave element including a piezoelectric substrate having input/output terminals, reference potential terminals, in-series arm IDTs between the input/output terminals, in-parallel arm IDTs between the in-series arm IDTs and the reference potential terminals arranged to define a ladder circuit;
a package enclosing the at least one surface acoustic wave element and having electrode lands connected respectively with the input/output terminals and the reference potential terminals of the at least one surface acoustic wave element, the package further having external terminals connecting the electrode lands on the outer surface thereof;

bonding wires connecting the reference potential terminals of the at least one surface acoustic wave element with the electrode lands of the package; wherein said surface acoustic wave filter is adapted and arranged to be used in a superheterodyne system; and the capacity of the in-parallel arm IDTs, the number of the bonding wires connected with the reference potential terminals, the number of electrode lands connected with the reference potential terminals through the bonding wires, the connecting positions of the bonding wires corresponding to the reference potential terminals and the electrode lands have been set such that the resonance frequency of a resonator having the capacities of the in-parallel arm IDTs of the at least one surface acoustic wave element and having inductances from the reference potential terminals of the at least one surface acoustic wave element to the external terminals of the package, is positioned in the vicinity of an image frequency occurring at the time of performing frequency conversion in the superheterodyne system.

* * * * *